United States Patent
Vandam et al.

(10) Patent No.: US 9,819,258 B1
(45) Date of Patent: Nov. 14, 2017

(54) SYSTEMS AND METHODS FOR LATCH-UP DETECTION AND MITIGATION

(71) Applicant: Intel Corporation, Santa Clara, CA (US)

(72) Inventors: Clark Vandam, Hilsboro, OR (US);
Suriya Kumar, Portland, OR (US);
Suraj Sindia, Hillsboro, OR (US);
Ricardo Ascazubi, Portland, OR (US);
Curtis Shirota, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/283,084

(22) Filed: Sep. 30, 2016

(51) Int. Cl.
*H03K 19/003* (2006.01)
*H02M 1/32* (2007.01)
*H02M 1/36* (2007.01)
*G11C 5/14* (2006.01)

(52) U.S. Cl.
CPC .............. *H02M 1/32* (2013.01); *H02M 1/36* (2013.01)

(58) Field of Classification Search
CPC ............. H03K 19/00346; H03K 17/08; H03K 2017/0803; H03K 17/082; H03K 17/20; H03K 19/003; G11C 5/147; G11C 5/143; G11C 5/14
See application file for complete search history.

(56) References Cited

U.S. PATENT DOCUMENTS

| | | | |
|---|---|---|---|
| 7,501,849 B2* | 3/2009 | Perisetty | H03K 19/00315 326/15 |
| 8,710,899 B2* | 4/2014 | George | H03K 17/284 327/427 |
| 2010/0052766 A1* | 3/2010 | Pike | G06F 1/266 327/401 |

* cited by examiner

*Primary Examiner* — Gary L Laxton
(74) *Attorney, Agent, or Firm* — Nicholson De Vos Webster & Elliott LLP

(57) ABSTRACT

Systems and methods for latch-up detection and mitigation. One aspect includes a method implemented in a system divided into a plurality of power blocks, where each power block is powered by a corresponding power rail and includes a voltage droop monitoring circuitry. The method comprises receiving frequency information from the plurality of voltage droop monitoring circuitries; normalizing the received frequency information from each of the plurality of voltage droop monitoring circuitries; creating a matrix of cross-correlation values based on the normalized frequency information between each pair of the plurality of power blocks; determining deviations in the cross-correlation values indicating an occurrence of voltage droop; determining an abnormal variation based on the determined deviations to identify a first power block, out of the plurality of power blocks, experiencing a latch-up event; and resetting power to the first power block without interrupting power to rest of the plurality of power blocks.

20 Claims, 15 Drawing Sheets

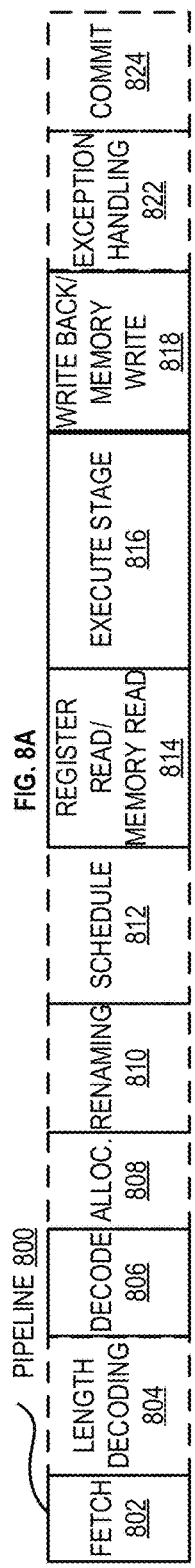
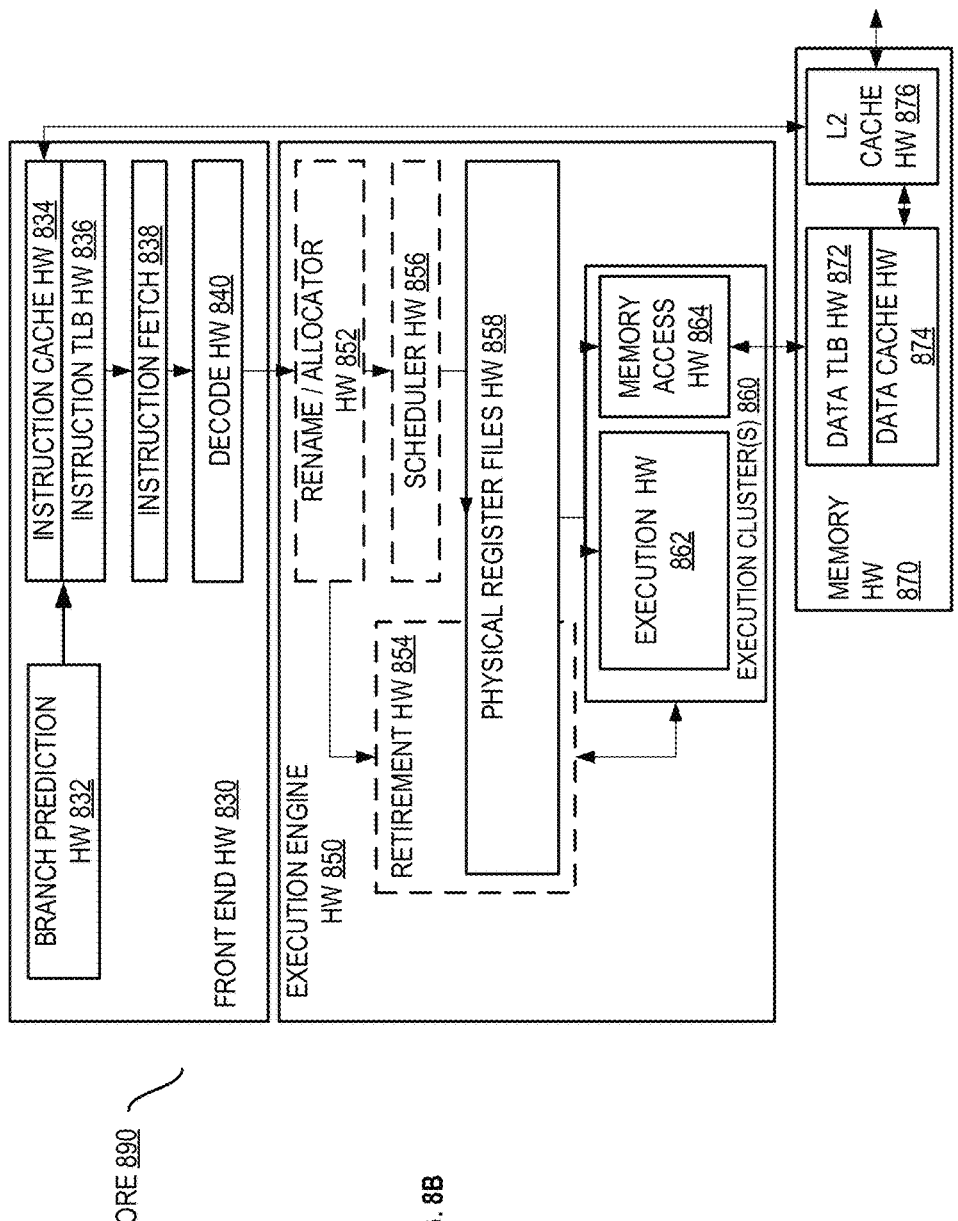

SYSTEMS AND METHODS FOR LATCH-UP DETECTION AND MITIGATION

BACKGROUND INFORMATION

Latch-up is a type of short circuit that occurs in an integrated circuit (IC). It is a failure condition characterized by runaway current railing (i.e., creation of a low-impedance path between power supply rails of the IC) due to bipolar amplification of electron-hole pairs. The p-n junction formed between active devices and the substrate, which are normally reverse biased, can become forward biased due to, for example, the absorption of cosmic radiation by the substrate. Such events (radiation-induced latch-up or Single-event Latch-up) cause a short circuit of current flow between power and ground rails that is typically well localized (i.e., within a few microns) to the vicinity of radiological absorption.

Errors caused by latch-up may be characterized as hard errors or soft errors. Soft errors may be resolved by a power reset or power cycle while hard errors are more catastrophic and permanent, tending to result in railing current, severe voltage droop, and thermal overload. Soft errors may become hard errors if they are left undetected and unmitigated, such as when power is not interrupted in the affected regions or components to reset the latch-up condition.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein like reference numerals refer to like parts throughout the various views unless otherwise specified:

FIG. 8A is a block diagram illustrating both an exemplary in-order pipeline and an exemplary register renaming, out-of-order issue/execution pipeline according to embodiments of the invention;

FIG. 8B is a block diagram illustrating both an exemplary embodiment of an in-order architecture core and an exemplary register renaming, out-of-order issue/execution architecture core to be included in a processor according to embodiments of the invention;

DETAILED DESCRIPTION

Embodiments implementing methods and systems for latch-up detection and mitigation are described herein. In the following description, numerous specific details are set forth to provide a thorough understanding of embodiments of the invention. One skilled in the relevant art will recognize, however, that the invention can be practiced without one or more of the specific details, or with other methods, components, materials, structures, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. For clarity, individual components in the Figures herein may be referred to by their labels in the Figures, rather than by a particular reference number.

Figure 1:
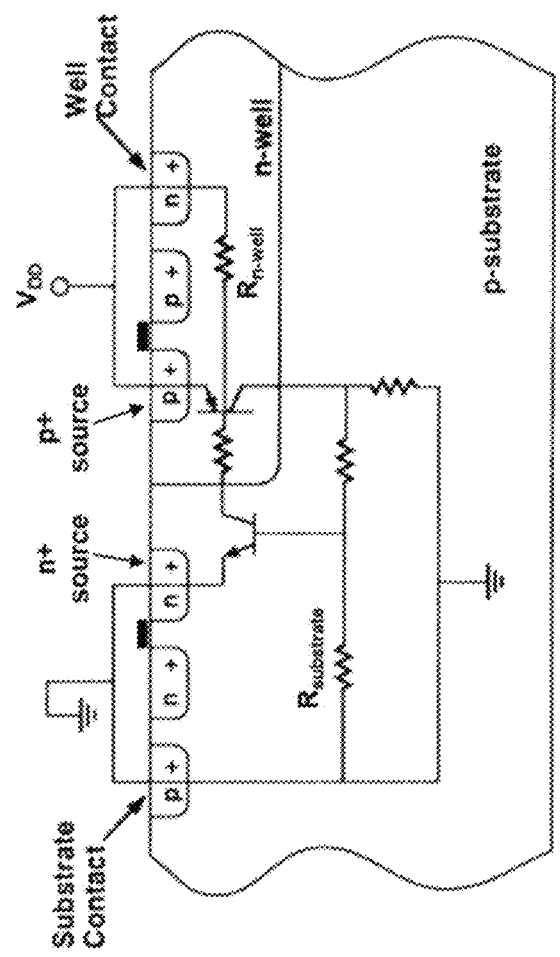
FIG. 1 illustrates a bipolar amplifier formed from parasitic junctions in a CMOS (complementary metal-oxide-semiconductor) process.

Integrated circuits built on a silicon (Si) substrate are susceptible to latch-up condition. In the field, these types of failures are often observed as a momentary glitch (e.g. Windows blue screen of death) and are often resolved by a full power reset. The failures are attributed to random soft-error radiological events, triggered by photon absorption and subsequent electron-hold pair generation in the vicinity of the pn-junctions formed between active devices and the substrate. Occasionally such events will trigger bipolar amplification (npn/pnp), leading to cascaded avalanche breakdown across the normally reversed biased junction to substrate. FIG. 1 illustrates a bipolar amplifier formed from parasitic junctions in a CMOS (complementary metal-oxide-semiconductor) process. While this phenomenon is typically well localized, the broader circuitry is affected as manifested by a voltage droop on the power rail caused by the railing current between power and ground. The monitoring of voltage droops on each power rail provides the basic mechanism by which latch-up events can be detected.

Latch-up events cause errors that may be characterized as hard failures and soft failures. Hard failures, which are permanent and consistent, tend to cause irreversible damages to the circuit system requiring expensive repairs and/or replacements. Soft failures, on the other hand, tend to be less severe and can usually be recovered after a power cycle. Nonetheless, soft failures, if left uninterrupted and unmitigated, can easily turn into hard failures by causing severe thermal and structural damages. Thus, the latch-up detection and mitigation scheme described herein aims to reduce permanent hardware damage associated with latch-up events by automatically identified and quickly resolve soft failures.

Aspects of the present invention provides detection mechanisms for detecting latch-up invents based on monitoring voltage droops. In one embodiment, the voltage droop monitor is designed to operate on a power rail separate from that which it is monitoring for latch-up. In another embodiment, the monitor circuitry is designed to operate at low voltage, which is often consistent with the characteristics of a brown-out condition caused by railing current on the load line of a power supply. Alternatively, one or more monitor circuitries may be staggered to monitor the latch-up detection signal from adjacent blocks, each of which derives power separately from each of the monitored blocks. Other aspects of the present invention include methods for analyzing the voltage droop data and figuring out where latch-up events are potentially taking place. In one embodiment, collected voltage droop data are fed into an intelligent latch-up detector based on a finite state machine (FSM), supervised learning machine, or unsupervised learning machine to determine the threat level for each monitored power block with respect to latch-up. According to an embodiment, the intelligent latch-up detector is preferred because conventional latch-up detection solutions cannot discern normal voltage droop that can happen due to local or global supply line noise, from the more egregious source of droops resulting from a latch-up condition.

Figure 2:
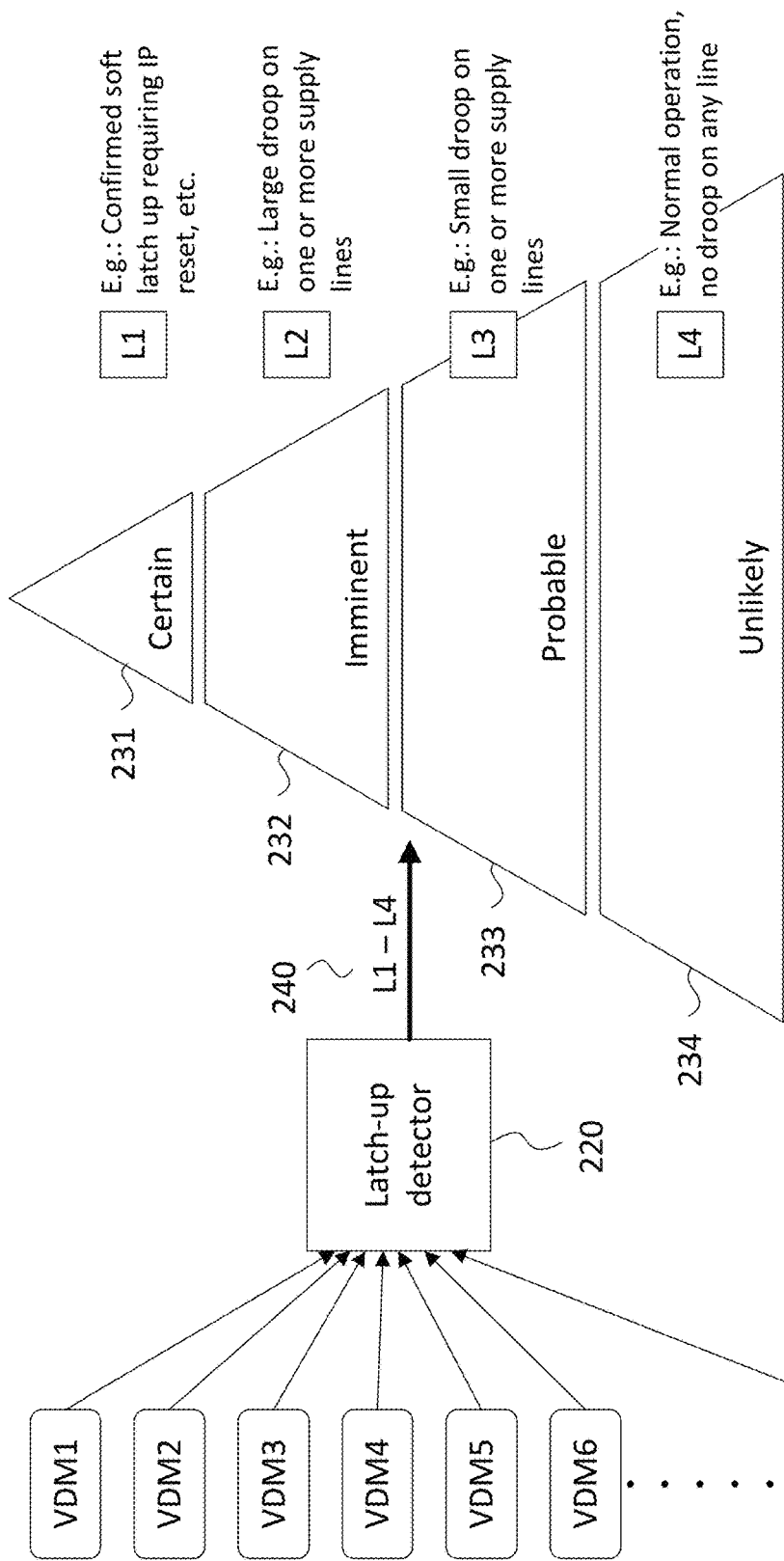
FIG. 2 is an overview of the latch-up detection and mitigation aspects according to an embodiment of the present invention.

FIG. 2 is a schematic diagram illustrating an overview of the latch-up detection and mitigation aspects of the present invention according to an embodiment. In FIG. 2, a voltage droop monitor (e.g., VDM1-VDM n) is implemented for each power block to be monitored for latch-up events. The data collected from each of the VDMs is then outputted to and collected by the latch-up detector 220. The latch-up detector, after analyzing the collected data, outputs a one or more results 240. In one embodiment, a result is generated for each power block. The result indicates the level of threat determined for each power block based on the analysis of the collected data. According to an embodiment, the result generated is one of four levels, L1-L4 (e.g., 231-234). Each level corresponds to a degree of likelihood that a latch-up event is occurring. For example, L1 231 indicates with certainty that a latch-up event is occurring, L2 232 indicates that a latch-up event may not currently be occurring but is imminent, L3 233 indicates that the latch-up event is probable, and L4 234 indicates no risk of any latch-up events occurring. Each threat level is associated with one or more mitigation measures to be taken.

Figure 3A:
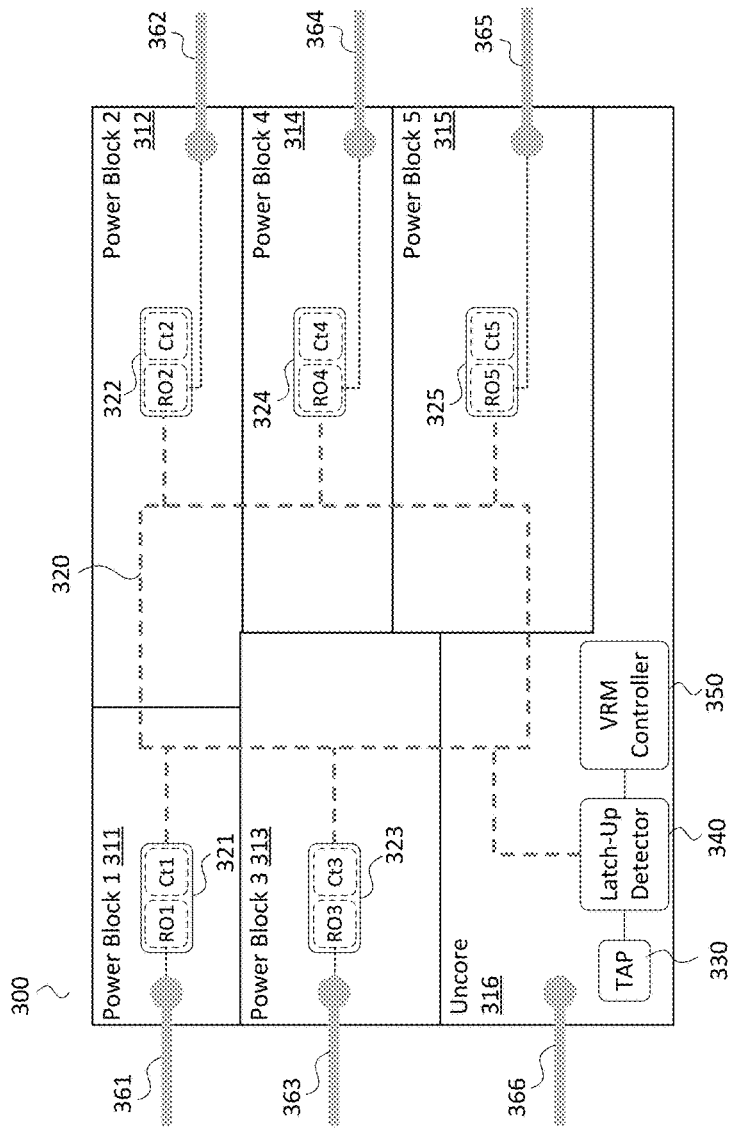
FIG. 3A is a block diagram illustrating an exemplary system implementing aspects of the present invention according to an embodiment.

FIG. 3A is a block diagram illustrating an exemplary system 300 for implementing aspects of the present invention according to an embodiment. System 300 comprises one or more power blocks (e.g., 311-315). A power block may be a region, a device, a component of a particular device, etc. that is being monitored for latch-up events. A power block may be physical or logical. In one embodiment, the system 300 is a multi-core processor and each power block represents a processor core, a cache memory, a caching agent, etc. In another embodiment, the system is the computer and each power block is a computer component, such as memory controller, hard drive controller, Ethernet card, graphics card, etc. Of course, these examples are in no ways limiting and aspects of the present invention may be implemented in any system that may benefit from latch-up detection and mitigation.

In FIG. 3A, power blocks 311-315 are monitored for latch-up events. Each power block is coupled to, and powered by, a corresponding power rail (e.g., 361-365). A voltage droop monitor (e.g., 321-325) corresponding to each power block monitors is connected to the block's power rail to monitor for voltage droops in that block. The voltage droop monitors 321-325 are further coupled to a latch-up detector 340 through a bus interconnect 320. According to an embodiment, the latch-up detector 340 utilizes, or is based, on a finite state machine (FSM). The latch-up detector 340 is further coupled to a test access point (TAP) 330 and a voltage regulator module (VRM) controller 350. The voltage droop monitors 321-325, latch-up detector 340, TAP 330, as well as the VRM controller 350 may be implemented as software, as hardware circuitries, or as a combination both. As illustrated in FIG. 3, TAP 330 and VRM controller 350 are separate from the latch-up detector 340. However, in alternate embodiments, TAP 330 and VRM controller 350 may be included as part of latch-up detector. Moreover, as illustrated in FIG. 3A, the latch-up detector 340, TAP 330, and the VRM controller 350 are on the uncore 316 which runs on a power rail 366 that is separate from the power rails 361-365 of the monitored power blocks 311-315.

Each voltage droop monitor 321-325, according to an embodiment, comprises a ring oscillator (e.g., RO1-RO5) and a counter (e.g., Ct1-Ct5). The ring oscillator may be voltage-based or current-based. In one embodiment, each voltage droop monitor is connected or tapped into the power rail of a monitored block. The voltage droop monitor works by converting the voltage from the power rail to the monitored power block into a voltage signal which causes the ring oscillator (e.g., RO1-RO5) to oscillate. An increase in voltage increases the frequency of the ring oscillator while a decrease in voltage (i.e. a voltage droop) decreases the frequency of the oscillation. According to another embodiment, the frequency of the oscillation is based on monitoring the leakage current. The frequency serves as a proxy for detecting voltage droops which are likely caused by a runaway short circuit current drawn by a latch-up on the power rail. In one embodiment, the monitored frequency is tracked and/or recorded by the counter (e.g., Ct1-Ct5) in the voltage droop monitor. Any change in time delay or frequency in the power block will vary the number of counts by the counter.

Figure 3B:
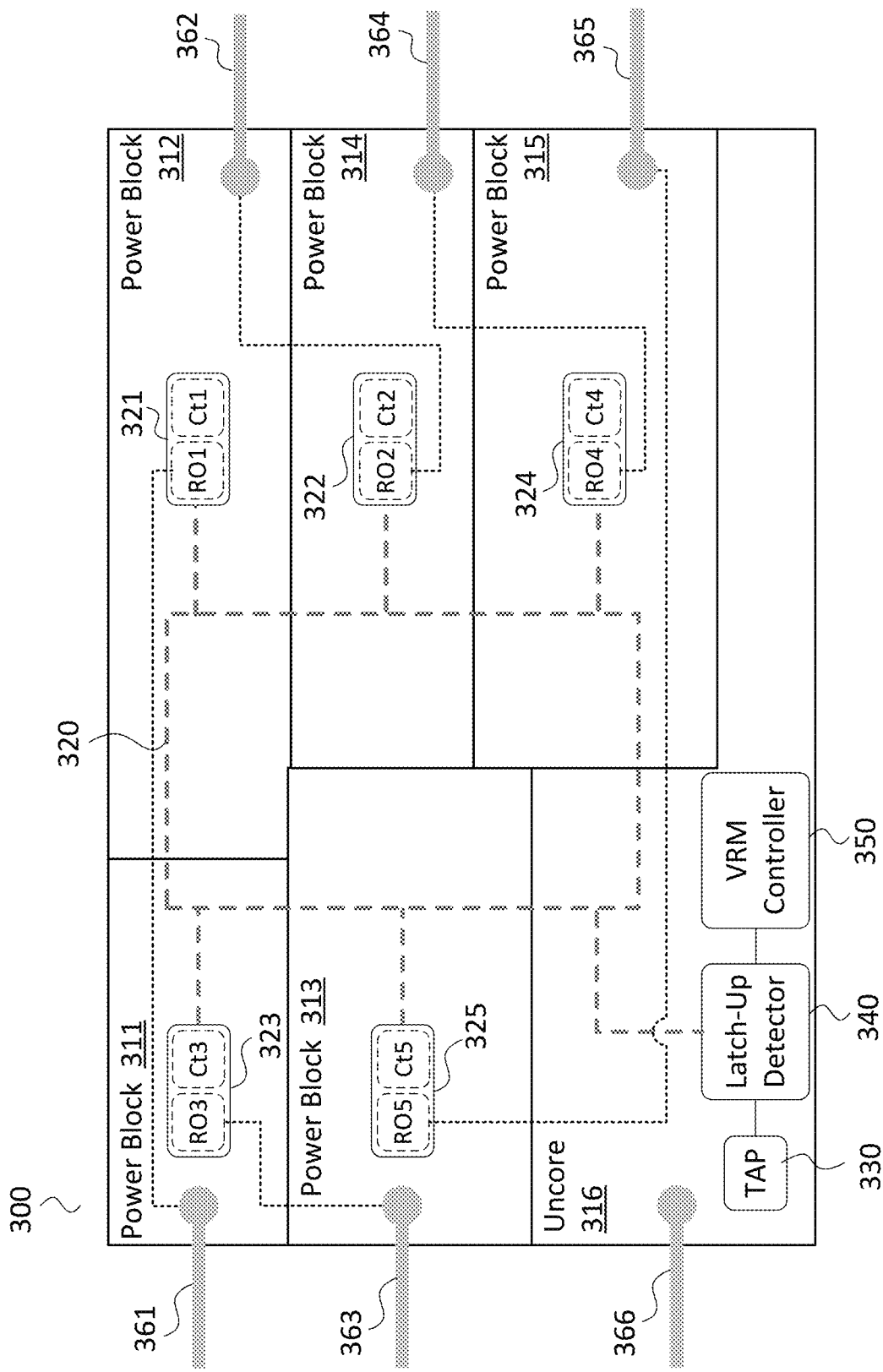
FIG. 3B is a block diagram illustrating exemplary system implementing aspects of the present invention according to another embodiment.

In one embodiment, the voltage droop monitor (i.e. 321-325) is designed to operate on a power rail separate from that which it is monitoring for latch-up. In another embodiment, the voltage droop monitor is designed to operate at low voltage, which is often consistent with the characteristics of a brown-out condition caused by a railing current on the load line of the power supply. Alternatively, voltage droop monitors may be staggered to monitor the latch-up detection signal from an adjacent block, so as to not be affect by the voltage droop occurring in the monitored block. FIG. 3B shows an embodiment of system 300 implementing such staggered configuration. In FIG. 3B, voltage monitor 321 which is monitoring power block 311 actually resides in the adjacent power block 312 and is powered by power rail 362 of block 312 rather than power rail 361 of block 311. Other voltage monitors 322-324 are similarly configured.

Voltage droop monitors 321-325 sends the tracked/recorded frequency or counter rate to the latch-up detector 340 via the interconnect 320. According to an embodiment, latch-ups are detected by the latch-up detector using intra-die-variation (IDV) based methods to analyze the frequency or count rate provided by the voltage droop monitors. In one implementation, the latch-up detector includes a startup mode and a run mode. On startup, a baseline ring oscillation frequency or count rate is taken from the voltage droop monitors to establish a reference or baseline condition for each power rail. For example, the latch-up detector may set the average frequency or count rate over a short sampling period as the baseline for the power block from which the frequency or count rates are taken from. After establishing a baseline frequency or count rate, the latch-up detector then enters into run mode to monitor for abrupt changes in the frequency or count rate of each power rail. Alternatively, in another embodiment, the expected frequency/count rate baseline is predetermined for each power block and hardwired into the latch-up detector. This enables instant-on latch-up detection without the need for a sampling period to establish baseline measurements.

In run mode, a simple relative percent change in monitored frequency or count rate is used to detect latch-up. For example, in an embodiment, a 20% drop in frequency within a certain amount of time indicates latch-up. In another embodiment, adaptive algorithms are used instead of a fixed relative percentage. For example, a predetermined natural range of variability for each power rail under normal operations is stored in the memory registers or hardwired look up tables within the latch-up detector or in another location accessible by the latch-up detector. Deviations from the normal range of variability indicate latch-up. Such adaptive algorithm for latch-up detection is robust and able to account for drifts and aging within the circuitry itself. Over time, age and stress within the circuitry tend to affect the frequency measured.

Once latch-up condition is detected in a power block, according to an embodiment, the latch-up detector signals the VRM controller which operates to cause a full reset of the power to the block experiencing the latch-up. According to an embodiment, while individual power blocks that are experiencing latch-up resets, the overall system remains on and operational. In one embodiment, only a minor time lag is required to reset the power rail, reset memory/register state, repeat instruction stream, and continue execution. A power reset to the power block experiencing latch-up will prevent a soft failure from becoming a hard failure. Further, only the power block on the affected power rail needs to be reset, rather than the entire system of power blocks.

According to another embodiment, instead of simple relative percent change or adaptive algorithms, advanced analysis is performed by an intelligent latch-up detector. Data collected from various voltage droop monitors are continuously sampled at an appropriate sampling period (Ts) by the latch-up detector. The sampled data from various voltage droop monitors are collected by an epoch collector of the latch-up detector. The epoch collector collects sampled data for a duration $T_E$ known as the epoch period. Each epoch period is an integral multiple of the sampling period $T_S$ (i.e. $T_E=n\times Ts$, where $n\geq 1$). According to the embodiment, epoch period $T_E$ is the minimum duration by which voltage droop data need to be collected in order to determine a change in the inferred latch-up event likelihood.

Once sufficient data have been collected, such as after continuously collecting data for each sampling period $T_S$ over duration $T_E$, the data collected by the epoch collector are normalized. According to an embodiment, the data collected are normalized relative to the minimum and maximum values in each data set collected from each voltage droop monitor over an epoch period. For example, the minimum and maximum frequency collected by a voltage droop monitor (e.g., voltage droop monitor 321 of FIGS. 3A and 3B) over an epoch period are set to 0.0 and 1.0 respectively. Each of the other frequencies in the collected data set is then adjusted proportionally (i.e., normalized) to a number between the minimum (0.0) and maximum (1.0). Data normalization harmonizes data streams from various sources and epoch periods, as each data source (i.e. voltage droop monitor) will have its respective minimum and maximum frequency or leakage current values for any given epoch period $T_E$. Normalization limits all frequency and leakage current data collected to a value between 0.0 and 1.0.

Figure 4:
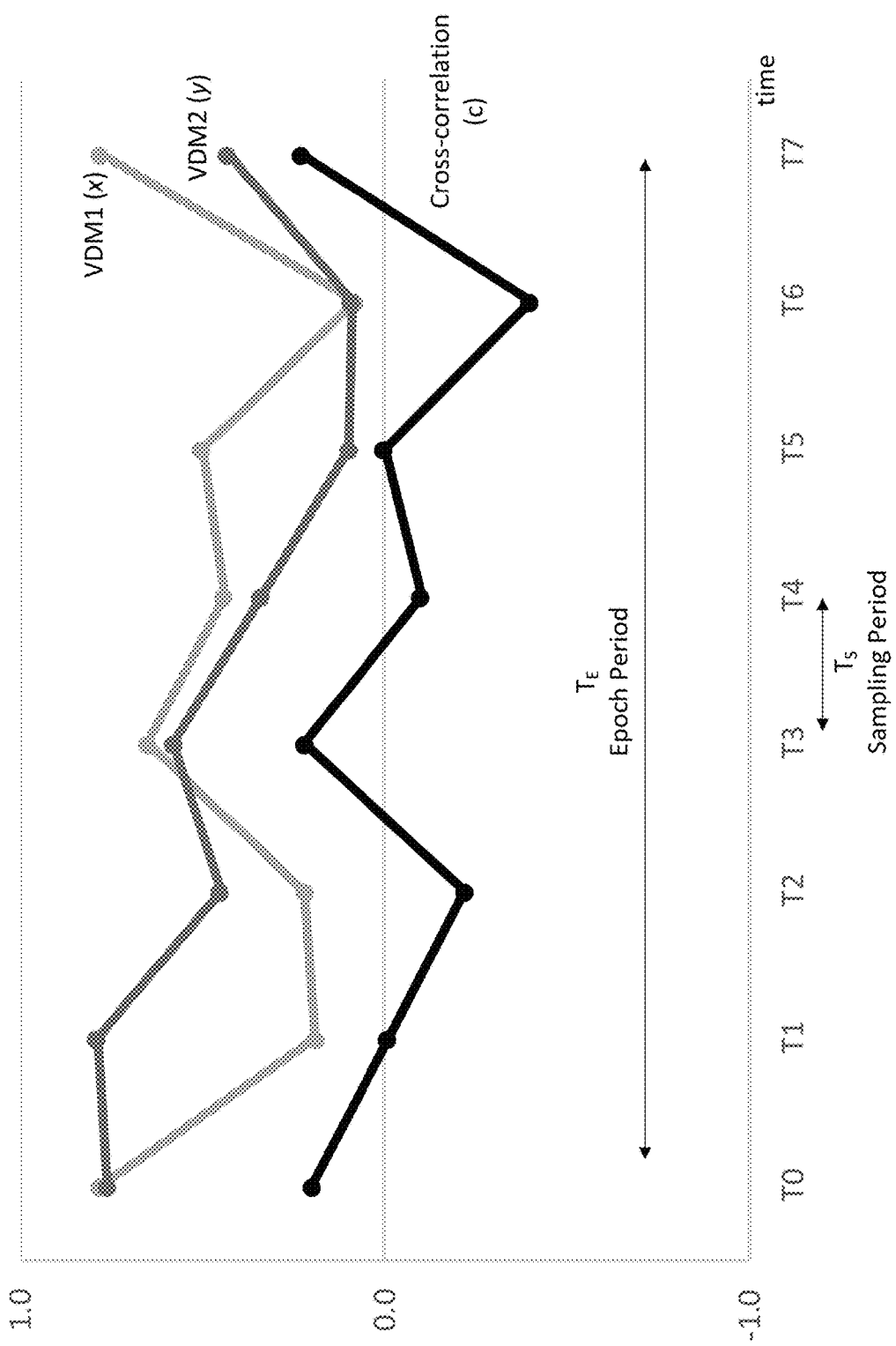
FIG. 4 is a graph illustrating the cross-correlation between data collected by a pair of voltage droop monitors according to an embodiment.

Subsequent to data normalization, a cross-correlation on the data among each pair of voltage droop monitor is computed. FIG. 4 is an exemplary graph illustrating the cross-correlation between pair-wise data collected by VDM1 and VDM2 over an epoch period. Sample period $T_S$ is the time duration between two consecutive samples and epoch period $T_E$ is the duration over which samples are collected before cross-correlation is computed. According to the embodiment illustrated in FIG. 4, $T_S$ is 1 μs and $T_E$ is 7 μs. Epoch period $T_E$ spans over sampling periods $T_1$-$T_7$. The cross-correlation is computed between VDM1 and VDM2 at each sampling instant ($T_1$-$T_7$) over the epoch period.

The cross correlation between each pairs of the voltage droop monitors is calculated by the following equations. Equation (1) calculates the covariance $C_{xy}$ between the frequency data collected from two VDMs, denoted as X and Y, for each sampling period $T_S$ over epoch period $T_E$ at lags $k=0, \pm 1, \pm 2, \ldots$. The symbols $\bar{x}$ and $\bar{y}$ denote means of the respective data collected over the epoch period.

$$c_{xy}(k) = \begin{cases} \frac{1}{n}\sum_{t=1}^{n-k}(x_t - \bar{x})(y_{t+k} - \bar{y}), & k = 0, 1, 2, \ldots \\ \frac{1}{n}\sum_{t=1}^{n+k}(y_t - \bar{y})(x_{t-k} - \bar{x}), & k = 0, -1, -2, \ldots \end{cases} \quad (1)$$

Once the covariance is calculated, the cross-correlation $r_{xy}$ is found with equation (2):

$$r_{xy}(k) = \frac{c_{xy}(k)}{s_x s_y}, k = 0, \pm 1 \cdot \pm 2, \ldots , \quad (2)$$

where standard deviations $S_x$ and $S_y$ are calculated by their respective equation (3).

$$S_x = \sqrt{c_{xx}(0)}, \text{ where } c_{xx}(0) = Var(x) \quad (3)$$

$$S_y = \sqrt{c_{yy}(0)}, \text{ where } c_{yy}(0) = Var(y) \quad (3)$$

Figure 5:
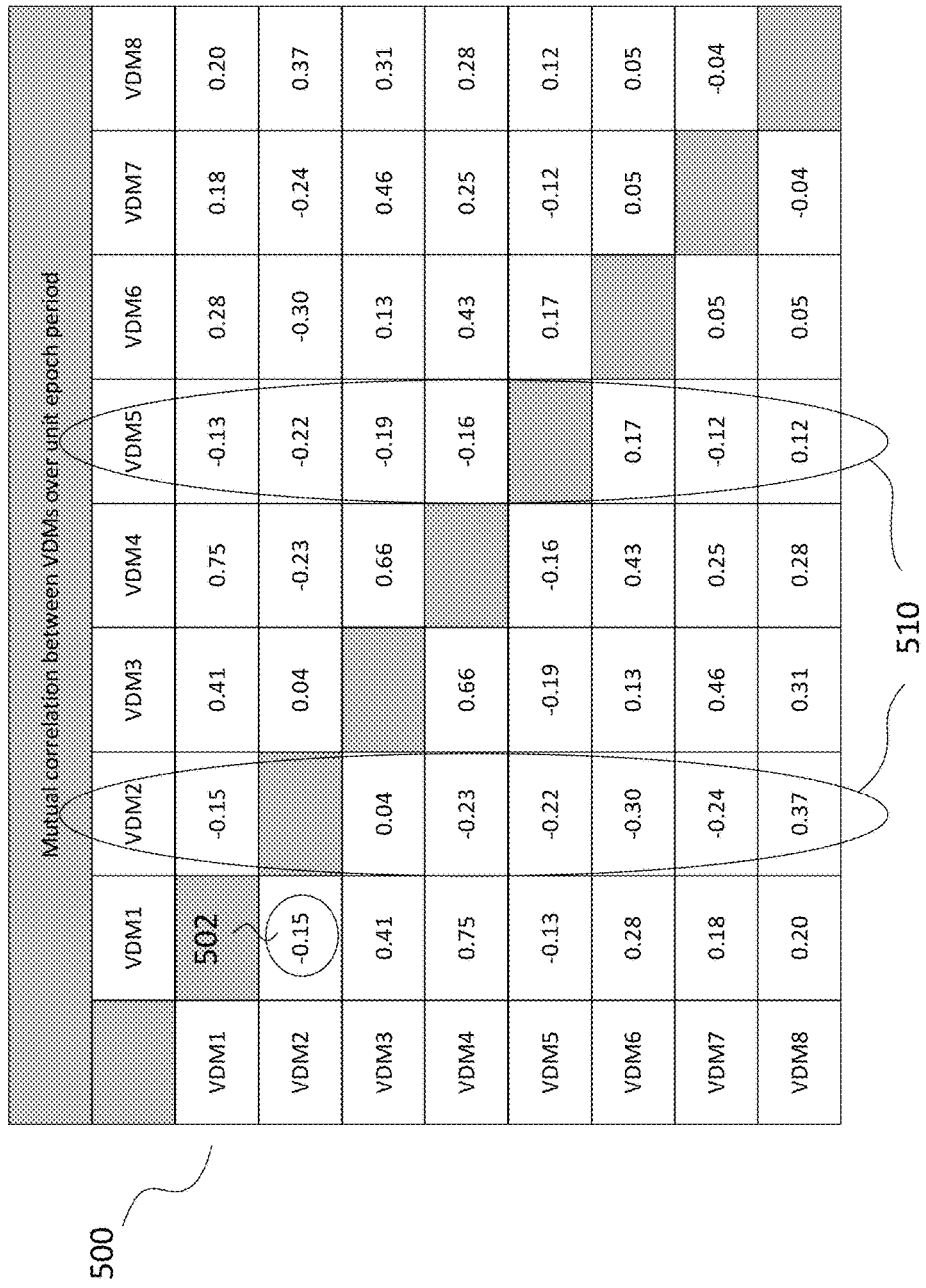
FIG. 5 illustrates an embodiment of a cross-correlation matrix generated by a latch-up detection circuitry.

The results of this computation is stored in a cross-correlation matrix. FIG. 5 illustrates an exemplary cross-correlation matrix 500 between each pairs of voltage droop monitors (VDMs) from VDM1 to VDM8. Once all cross-correlation data have been calculated, they are analyzed for potential latch-up conditions. For instance, in FIG. 5, VDM2 and VDM5 have consistent lower cross-correlation value when compared to other VDMs. This is evidenced by the observation that the circled values 510 are mostly negative. As such VDM2 and VDM5 are likely experiencing a voltage droop which suggests the occurrence of a latch-up event.

Cross-correlation matrices, such as 500, are computed and collected over multiple epoch periods. According to an embodiment, each of these cross-correlation matrices are inputted into a finite state machine (FSM) or supervised learning machine. In another embodiment, the cross-correlation matrices are inputted into a neural-network (NN) based unsupervised learning machine to determine the relevance of each sensed voltage droop occurrences. According to an embodiment, the NN is a four threat level (L1-L4) output winner-take-all implementation. Alternatively, the NN is implemented to output a single k-means cluster to designate the four clusters corresponding to four threat levels L1-L4. The threat level outputted from the FSM or NN-based unsupervised learning machine is used to determine the appropriate security measures or mitigation methods to be taken for each of the four threat levels L1-L4.

Figure 6:
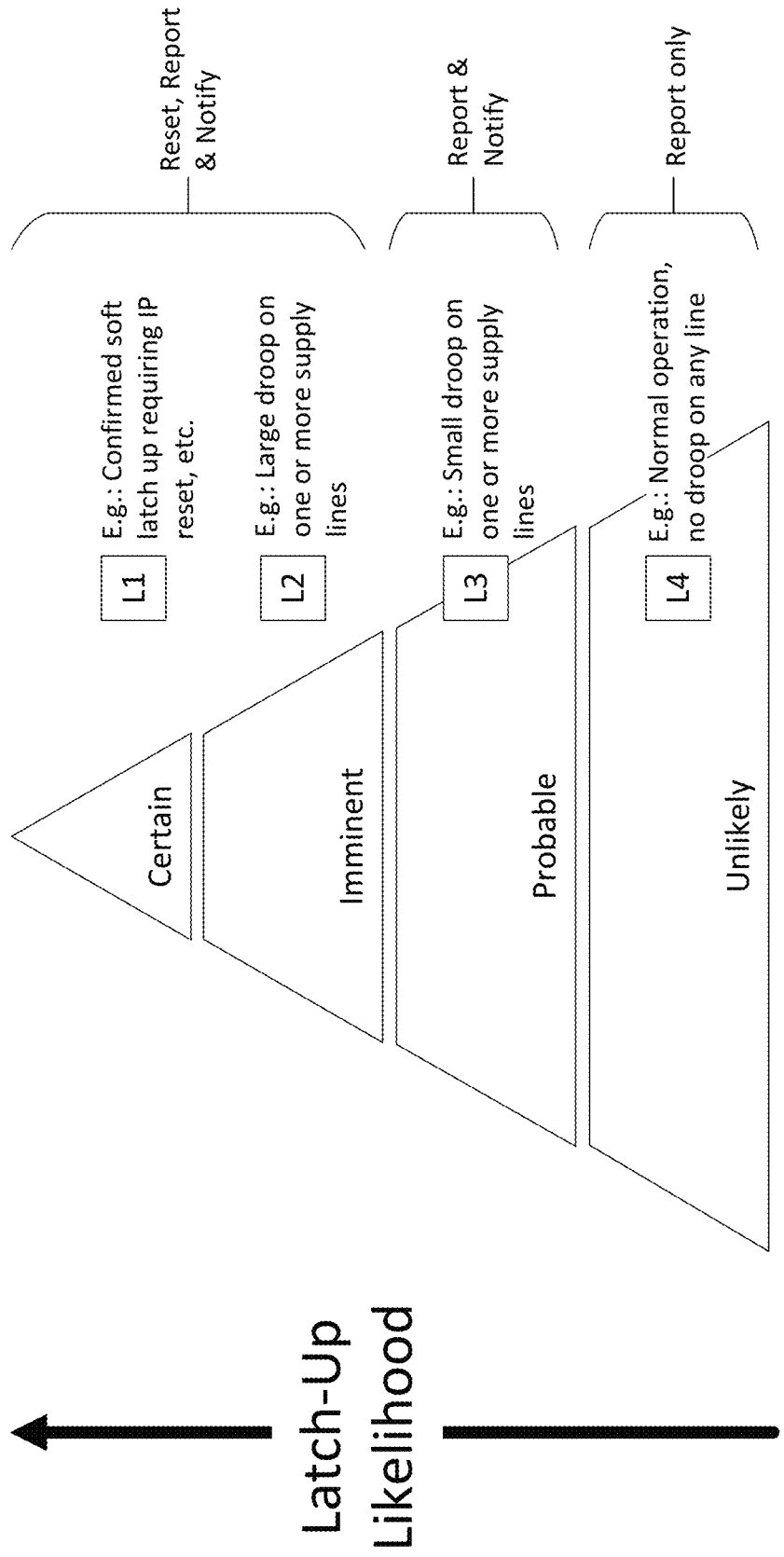
FIG. 6 illustrates an embodiment of a latch-up likelihood continuum segmented into multiple levels or categories of threat.

FIG. 6 illustrates an embodiment of a latch-up likelihood continuum segmented into four discrete levels or categories of threat, based on the results outputted by the FSM or NN-based unsupervised learning machine. Each level of threat indicates an associated likelihood of a latch-up event occurring. Also associated with each threat level is one more mitigation and/or reporting measures to be taken. For instance, L1, which indicates with certainty that a latch-up event is occurring within a particular power block, may cause the latch-up detector (e.g., 340 of FIGS. 3A and 3B) to signal the VRM controller (e.g., 350) to perform a power reset of the affected power block. According to an embodiment, a report is also generated and sent to a user/system administrator as well as stored in a systems log. In contrast, a L4 determination may simply lead to the generation of a report, which is then saved in a systems log without any notification to the user/system administrator.

Figure 7:
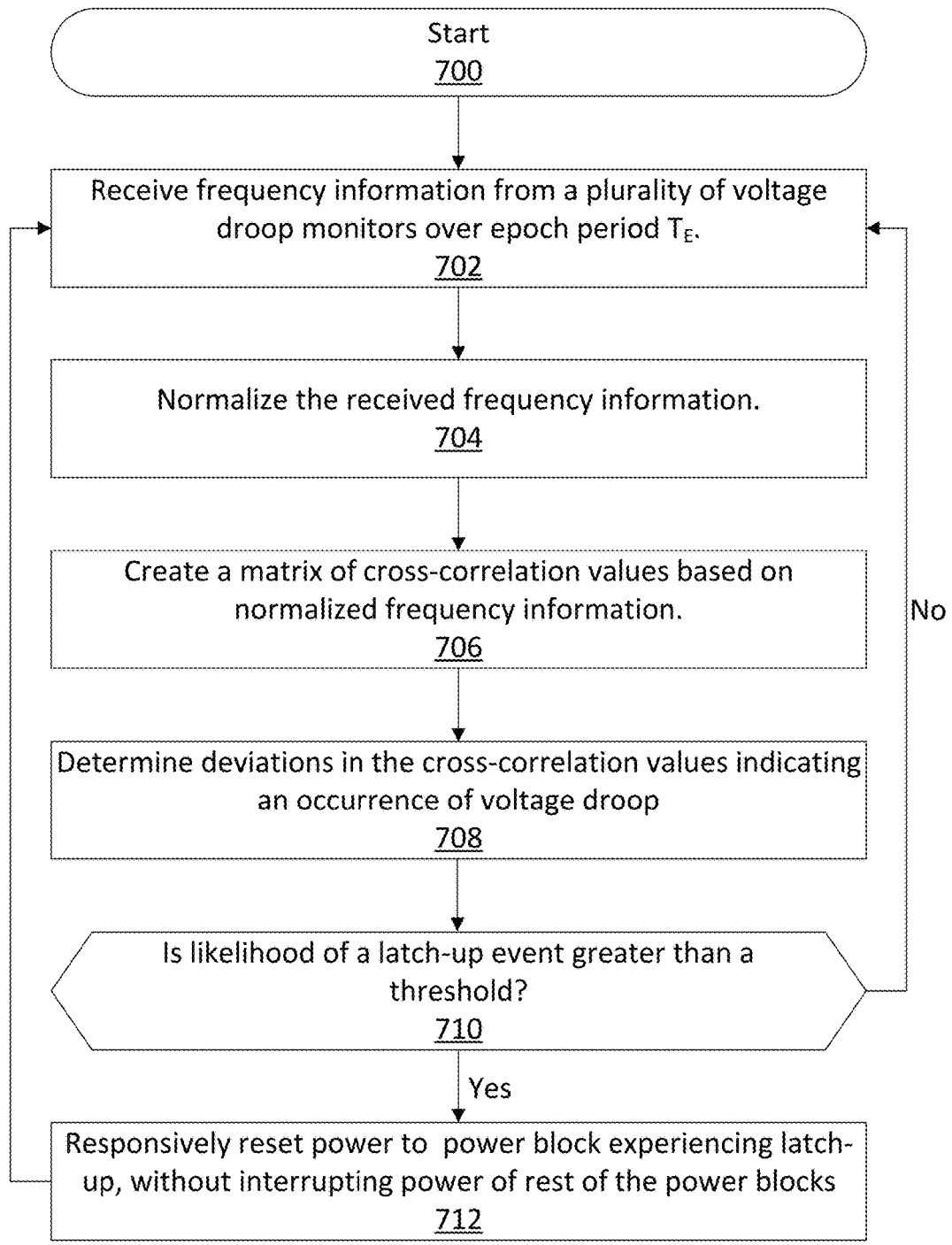
FIG. 7 is a flow diagram illustrating an embodiment of a method for detecting and mitigating a latch-up events in a system of power blocks.

FIG. 7 is a flow diagram illustrating an embodiment of a method for detecting and mitigating latch-up events in a system of power blocks. The method begins at block 700. At block 702, a latch-up detector receives frequency information from a plurality of voltage droop monitors, each voltage droop monitor corresponds to a power block. In addition, each of the voltage droop monitors is coupled to the power rail of the corresponding power block. According to an embodiment, the frequency information received from each voltage droop monitor is the oscillation frequency of a ring oscillator tracked by a counter. The counter is read and then reset at each sampling time TS. The frequency information (e.g., the count of the counter) at each sampling time is transmitted to the latch-up detector. The latch-up detector receives and collects the frequency information over an epoch period $T_E$, which includes multiple TS.

At block 704, the received frequency information is normalized. According to an embodiment, the minimum and maximum frequency received from each voltage droop monitor over the epoch period is set to 0.0 and 1.0 respectively. The rest of the received frequencies are then adjusted proportionally as a number between 0.0 and 1.0. At block 706, a matrix of cross-correlation values based on the normalized frequency information between each pairs of the voltage droop monitor is created. At block 708, deviations in the cross-correlation values for each voltage droop monitor are analyzed to determine the occurrence of voltage droops in each of the corresponding power blocks. According to an embodiment, a likelihood of latch-up event is generated for each power block based on the occurrence and severity of voltage droops. At block 710, a determination is made on whether the likelihood of a latch-up event occurring in each power block is greater than a threshold. For example, on a four-level scale with L1 indicating that a latch-up event is certain and L4 indicating no potential of a latch-up, a threshold may be set at L2. If the result of the determination at block 710 is that the likelihood of a particular power block experiencing latch-up is greater than the threshold, the power to that particular power block is reset. According to an embodiment, the power is reset by a VRM controller and the power reset of the particular power block does not affect or interrupt power of the rest of the power blocks. On the other hand, if at block 710 no power block has a likelihood of latch-up greater than the threshold, the method returns to block 702 where the latch-up detector continues to receive and collect frequency information from the plurality of voltage droop monitors over the next epoch period TE.

In certain embodiments, a system includes: a plurality of voltage droop monitoring circuitries, each of which corresponds to one of a plurality of power blocks and each power block is powered by a corresponding power rail; a latch-up detection circuitry communicatively coupled to the plurality of voltage droop monitoring circuitries, the latch-up detection circuitry to receive frequency information from the plurality of voltage droop monitoring circuitries and to determine an abnormal variation based on the received frequency information to identify a first power block from the plurality of power blocks that is experiencing a latch-up event; and a voltage regulator circuitry communicatively coupled to the latch-up detection circuitry and the corresponding power rails to cause a power reset in the first power block without interrupting power to rest of the plurality of power blocks. Each of the plurality of voltage droop monitoring circuitries may include a ring oscillator and a counter. In one instance, the ring oscillator measures a frequency based on a voltage of the power rail. In another instance, the ring oscillator measures a frequency based on a current of the power rail. The latch-up detection circuitry may normalize the received frequency information from each of the plurality of voltage droop monitoring circuitries, create a matrix of cross-correlation values based on the normalized received frequency information between each pair of the plurality of power blocks; and determine deviations in the cross-correlation values indicating an occurrence of voltage droop. The latch-up detection circuitry may also assign a likelihood of latch-up based on the determined deviations in the cross-correlation values. The likelihood of latch-up may include a plurality of levels. Each level of the plurality of levels may be associated with one or more mitigation measures. The mitigation measures may include signaling the voltage regulator circuitry to reset power to the first power block and/or reporting the latch-up event to a system administrator.

In another embodiment, a method is implemented in an integrated circuit, the method includes: receiving frequency information from a plurality of voltage droop monitoring circuitries each of which corresponds to each one of a plurality of power blocks and each power block powered by a respective power rail; determining an abnormal variation based on the received frequency information to identify a first power block from the plurality of power blocks that is experiencing a latch-up event; and resetting power to the first power block without interrupting power to rest of the plurality of power blocks. Each of the plurality of voltage droop monitoring circuitries may include a ring oscillator and a counter. In one instance, the method may include measuring a frequency of the ring oscillator based on a voltage or a current of the power rail. The method may also include normalizing the received frequency information from each of the plurality of voltage droop monitoring circuitries; creating a matrix of cross-correlation values based on the normalized frequency information between each pair of the plurality of power blocks; and determining deviations in the cross-correlation values indicating an occurrence of voltage droop. In addition, the method may also include assigning a likelihood of latch-up based on the determined deviations in the cross-correlation values. The likelihood of latch-up may include a plurality of levels. Each level of the plurality of levels may be associated with one or more mitigation measures. The mitigation measures may include resetting power to the first power block, reporting the latch-up event to a system administrator, and/or storing a report of the latch-up event in a system log.

FIG. 8A is a block diagram illustrating both an exemplary in-order pipeline and an exemplary register renaming, out-of-order issue/execution pipeline according to embodiments of the invention. FIG. 8B is a block diagram illustrating both an exemplary embodiment of an in-order architecture core and an exemplary register renaming, out-of-order issue/execution architecture core to be included in a processor according to embodiments of the invention. The solid lined boxes in FIGS. 8A-B illustrate the in-order pipeline and in-order core, while the optional addition of the dashed lined boxes illustrates the register renaming, out-of-order issue/execution pipeline and core. Given that the in-order aspect is a subset of the out-of-order aspect, the out-of-order aspect will be described.

In FIG. 8A, a processor pipeline 800 includes a fetch stage 802, a length decode stage 804, a decode stage 806, an allocation stage 808, a renaming stage 810, a scheduling (also known as a dispatch or issue) stage 812, a register read/memory read stage 814, an execute stage 816, a write back/memory write stage 818, an exception handling stage 822, and a commit stage 824.

FIG. 8B shows processor core 890 including a front end hardware 830 coupled to an execution engine hardware 850, and both are coupled to a memory hardware 870. The core 890 may be a reduced instruction set computing (RISC) core, a complex instruction set computing (CISC) core, a very long instruction word (VLIW) core, or a hybrid or alternative core type. As yet another option, the core 890 may be a special-purpose core, such as, for example, a network or communication core, compression engine, coprocessor core, general purpose computing graphics processing unit (GPGPU) core, graphics core, or the like.

The front end hardware 830 includes a branch prediction hardware 832 coupled to an instruction cache hardware 834, which is coupled to an instruction translation lookaside buffer (TLB) 836, which is coupled to an instruction fetch hardware 838, which is coupled to a decode hardware 840. The decode hardware 840 (or decoder) may decode instructions, and generate as an output one or more micro-operations, micro-code entry points, microinstructions, other instructions, or other control signals, which are decoded from, or which otherwise reflect, or are derived from, the original instructions. The decode hardware 840 may be implemented using various different mechanisms. Examples of suitable mechanisms include, but are not limited to, look-up tables, hardware implementations, programmable logic arrays (PLAs), microcode read only memories (ROMs), etc. In one embodiment, the core 890 includes a microcode ROM or other medium that stores microcode for certain macroinstructions (e.g., in decode hardware 840 or otherwise within the front end hardware 830). The decode hardware 840 is coupled to a rename/allocator hardware 852 in the execution engine hardware 850.

The execution engine hardware 850 includes the rename/allocator hardware 852 coupled to a retirement hardware 854 and a set of one or more scheduler hardware 856. The scheduler hardware 856 represents any number of different schedulers, including reservations stations, central instruction window, etc. The scheduler hardware 856 is coupled to the physical register file(s) hardware 858. Each of the physical register file(s) hardware 858 represents one or more physical register files, different ones of which store one or more different data types, such as scalar integer, scalar floating point, packed integer, packed floating point, vector integer, vector floating point, status (e.g., an instruction pointer that is the address of the next instruction to be executed), etc. In one embodiment, the physical register file(s) hardware 858 comprises a vector registers hardware, a write mask registers hardware, and a scalar registers hardware. These register hardware may provide architectural vector registers, vector mask registers, and general purpose registers. The physical register file(s) hardware 858 is overlapped by the retirement hardware 854 to illustrate various ways in which register renaming and out-of-order execution may be implemented (e.g., using a reorder buffer(s) and a retirement register file(s); using a future file(s), a history buffer(s), and a retirement register file(s); using a register maps and a pool of registers; etc.). The retirement hardware 854 and the physical register file(s) hardware 858 are coupled to the execution cluster(s) 860. The execution cluster(s) 860 includes a set of one or more execution hardware 862 and a set of one or more memory access hardware 864. The execution hardware 862 may perform various operations (e.g., shifts, addition, subtraction, multiplication) and on various types of data (e.g., scalar floating point, packed integer, packed floating point, vector integer, vector floating point). While some embodiments may include a number of execution hardware dedicated to specific functions or sets of functions, other embodiments may include only one execution hardware or multiple execution hardware that all perform all functions. The scheduler hardware 856, physical register file(s) hardware 858, and execution cluster(s) 860 are shown as being possibly plural because certain embodiments create separate pipelines for certain types of data/operations (e.g., a scalar integer pipeline, a scalar floating point/packed integer/packed floating point/vector integer/vector floating point pipeline, and/or a memory access pipeline that each have their own scheduler hardware, physical register file(s) hardware, and/or execution cluster—and in the case of a separate memory access pipeline, certain embodiments are implemented in which only the execution cluster of this pipeline has the memory access hardware 864). It should also be understood that where separate pipelines are used, one or more of these pipelines may be out-of-order issue/execution and the rest in-order.

The set of memory access hardware 864 is coupled to the memory hardware 870, which includes a data TLB hardware 872 coupled to a data cache hardware 874 coupled to a level 2 (L2) cache hardware 876. In one exemplary embodiment, the memory access hardware 864 may include a load hardware, a store address hardware, and a store data hardware, each of which is coupled to the data TLB hardware 872 in the memory hardware 870. The instruction cache hardware 834 is further coupled to a level 2 (L2) cache hardware 876 in the memory hardware 870. The L2 cache hardware 876 is coupled to one or more other levels of cache and eventually to a main memory.

By way of example, the exemplary register renaming, out-of-order issue/execution core architecture may implement the pipeline 800 as follows: 1) the instruction fetch 838 performs the fetch and length decoding stages 802 and 804; 2) the decode hardware 840 performs the decode stage 806; 3) the rename/allocator hardware 852 performs the allocation stage 808 and renaming stage 810; 4) the scheduler hardware 856 performs the schedule stage 812; 5) the physical register file(s) hardware 858 and the memory hardware 870 perform the register read/memory read stage 814; the execution cluster 860 perform the execute stage 816; 6) the memory hardware 870 and the physical register file(s) hardware 858 perform the write back/memory write stage 818; 7) various hardware may be involved in the exception handling stage 822; and 8) the retirement hardware 854 and the physical register file(s) hardware 858 perform the commit stage 824.

The core 890 may support one or more instructions sets (e.g., the x86 instruction set (with some extensions that have been added with newer versions); the MIPS instruction set of MIPS Technologies of Sunnyvale, Calif.; the ARM instruction set (with optional additional extensions such as NEON) of ARM Holdings of Sunnyvale, Calif.), including the instruction(s) described herein. In one embodiment, the core 890 includes logic to support a packed data instruction set extension (e.g., AVX1, AVX2, and/or some form of the generic vector friendly instruction format (U=0 and/or U=1), described below), thereby allowing the operations used by many multimedia applications to be performed using packed data.

It should be understood that the core may support multi-threading (executing two or more parallel sets of operations or threads), and may do so in a variety of ways including time sliced multithreading, simultaneous multithreading (where a single physical core provides a logical core for each of the threads that physical core is simultaneously multi-threading), or a combination thereof (e.g., time sliced fetching and decoding and simultaneous multithreading thereafter such as in the Intel® Hyperthreading technology).

While register renaming is described in the context of out-of-order execution, it should be understood that register renaming may be used in an in-order architecture. While the illustrated embodiment of the processor also includes separate instruction and data cache hardware 834/874 and a shared L2 cache hardware 876, alternative embodiments may have a single internal cache for both instructions and data, such as, for example, a Level 1 (L1) internal cache, or multiple levels of internal cache. In some embodiments, the system may include a combination of an internal cache and an external cache that is external to the core and/or the processor. Alternatively, all of the cache may be external to the core and/or the processor.

Figure 9:
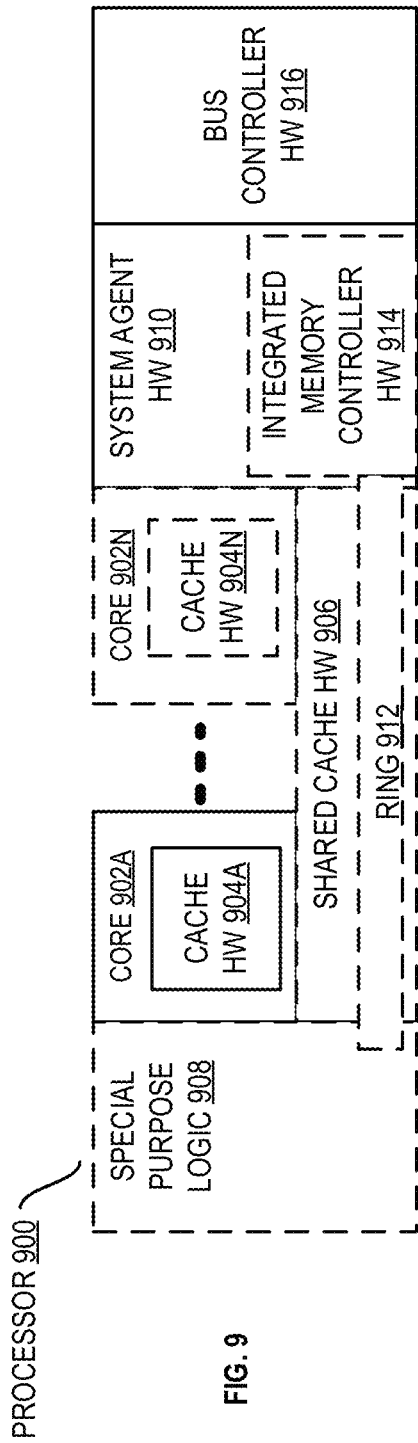
FIG. 9 is a block diagram of a single core processor and a multicore processor with integrated memory controller and graphics according to embodiments of the invention.

FIG. 9 is a block diagram of a processor 900 that may have more than one core, may have an integrated memory controller, and may have integrated graphics according to embodiments of the invention. The solid lined boxes in FIG. 9 illustrate a processor 900 with a single core 902A, a system agent 910, a set of one or more bus controller hardware 916, while the optional addition of the dashed lined boxes illustrates an alternative processor 900 with multiple cores 902A-N, a set of one or more integrated memory controller hardware 914 in the system agent hardware 910, and special purpose logic 908.

Thus, different implementations of the processor 900 may include: 1) a CPU with the special purpose logic 908 being integrated graphics and/or scientific (throughput) logic (which may include one or more cores), and the cores 902A-N being one or more general purpose cores (e.g., general purpose in-order cores, general purpose out-of-order cores, a combination of the two); 2) a coprocessor with the cores 902A-N being a large number of special purpose cores intended primarily for graphics and/or scientific (throughput); and 3) a coprocessor with the cores 902A-N being a large number of general purpose in-order cores. Thus, the processor 900 may be a general-purpose processor, coprocessor or special-purpose processor, such as, for example, a network or communication processor, compression engine, graphics processor, GPGPU (general purpose graphics processing unit), a high-throughput many integrated core (MIC) coprocessor (including 30 or more cores), embedded processor, or the like. The processor may be implemented on one or more chips. The processor 900 may be a part of and/or may be implemented on one or more substrates using any of a number of process technologies, such as, for example, BiCMOS, CMOS, or NMOS.

The memory hierarchy includes one or more levels of cache within the cores, a set or one or more shared cache hardware 906, and external memory (not shown) coupled to the set of integrated memory controller hardware 914. The set of shared cache hardware 906 may include one or more mid-level caches, such as level 2 (L2), level 3 (L3), level 4 (L4), or other levels of cache, a last level cache (LLC), and/or combinations thereof. While in one embodiment a ring based interconnect hardware 912 interconnects the integrated graphics logic 908, the set of shared cache hardware 906, and the system agent hardware 910/integrated memory controller hardware 914, alternative embodiments may use any number of well-known techniques for interconnecting such hardware. In one embodiment, coherency is maintained between one or more cache hardware 906 and cores 902-A-N.

In some embodiments, one or more of the cores 902A-N are capable of multi-threading. The system agent 910 includes those components coordinating and operating cores 902A-N. The system agent hardware 910 may include for example a power control unit (PCU) and a display hardware. The PCU may be or include logic and components needed for regulating the power state of the cores 902A-N and the integrated graphics logic 908. The display hardware is for driving one or more externally connected displays.

The cores 902A-N may be homogenous or heterogeneous in terms of architecture instruction set; that is, two or more of the cores 902A-N may be capable of execution the same instruction set, while others may be capable of executing only a subset of that instruction set or a different instruction set. In one embodiment, the cores 902A-N are heterogeneous and include both the "small" cores and "big" cores described below.

FIGS. 10-13 are block diagrams of exemplary computer architectures. Other system designs and configurations known in the arts for laptops, desktops, handheld PCs, personal digital assistants, engineering workstations, servers, network devices, network hubs, switches, embedded processors, digital signal processors (DSPs), graphics devices, video game devices, set-top boxes, micro controllers, cell phones, portable media players, hand held devices, and various other electronic devices, are also suitable. In general, a huge variety of systems or electronic devices capable of incorporating a processor and/or other execution logic as disclosed herein are generally suitable.

Figure 10:
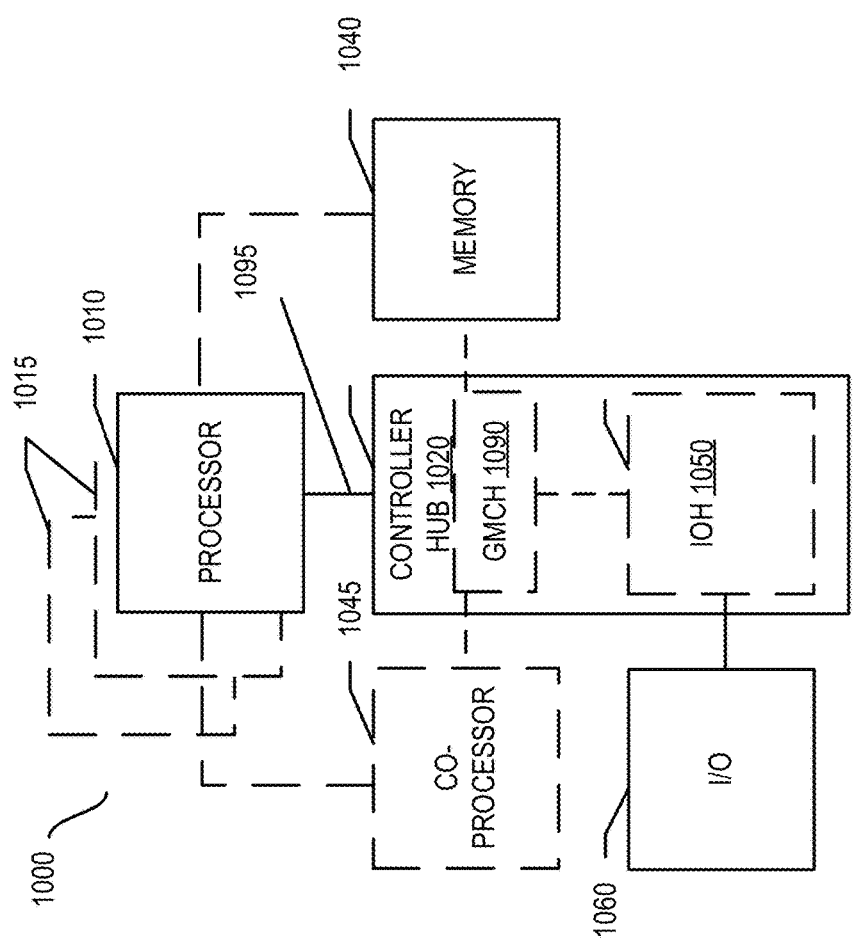
FIG. 10 illustrates a block diagram of a system in accordance with one embodiment of the present invention.

Referring now to FIG. 10, shown is a block diagram of a system 1000 in accordance with one embodiment of the present invention. The system 1000 may include one or more processors 1010, 1015, which are coupled to a controller hub 1020. In one embodiment the controller hub 1020 includes a graphics memory controller hub (GMCH) 1090 and an Input/Output Hub (IOH) 1050 (which may be on separate chips); the GMCH 1090 includes memory and graphics controllers to which are coupled memory 1040 and a coprocessor 1045; the IOH 1050 is couples input/output (I/O) devices 1060 to the GMCH 1090. Alternatively, one or both of the memory and graphics controllers are integrated within the processor (as described herein), the memory 1040 and the coprocessor 1045 are coupled directly to the processor 1010, and the controller hub 1020 in a single chip with the IOH 1050.

The optional nature of additional processors 1015 is denoted in FIG. 10 with broken lines. Each processor 1010, 1015 may include one or more of the processing cores described herein and may be some version of the processor 900.

The memory 1040 may be, for example, dynamic random access memory (DRAM), phase change memory (PCM), or a combination of the two. For at least one embodiment, the controller hub 1020 communicates with the processor(s) 1010, 1015 via a multi-drop bus, such as a frontside bus (FSB), point-to-point interface, or similar connection 1095.

In one embodiment, the coprocessor 1045 is a special-purpose processor, such as, for example, a high-throughput MIC processor, a network or communication processor, compression engine, graphics processor, GPGPU, embedded processor, or the like. In one embodiment, controller hub 1020 may include an integrated graphics accelerator.

There can be a variety of differences between the physical resources 1010, 1015 in terms of a spectrum of metrics of merit including architectural, microarchitectural, thermal, power consumption characteristics, and the like.

In one embodiment, the processor 1010 executes instructions that control data processing operations of a general type. Embedded within the instructions may be coprocessor instructions. The processor 1010 recognizes these coprocessor instructions as being of a type that should be executed by the attached coprocessor 1045. Accordingly, the processor 1010 issues these coprocessor instructions (or control signals representing coprocessor instructions) on a coprocessor bus or other interconnect, to coprocessor 1045. Coprocessor(s) 1045 accept and execute the received coprocessor instructions.

Figure 11:
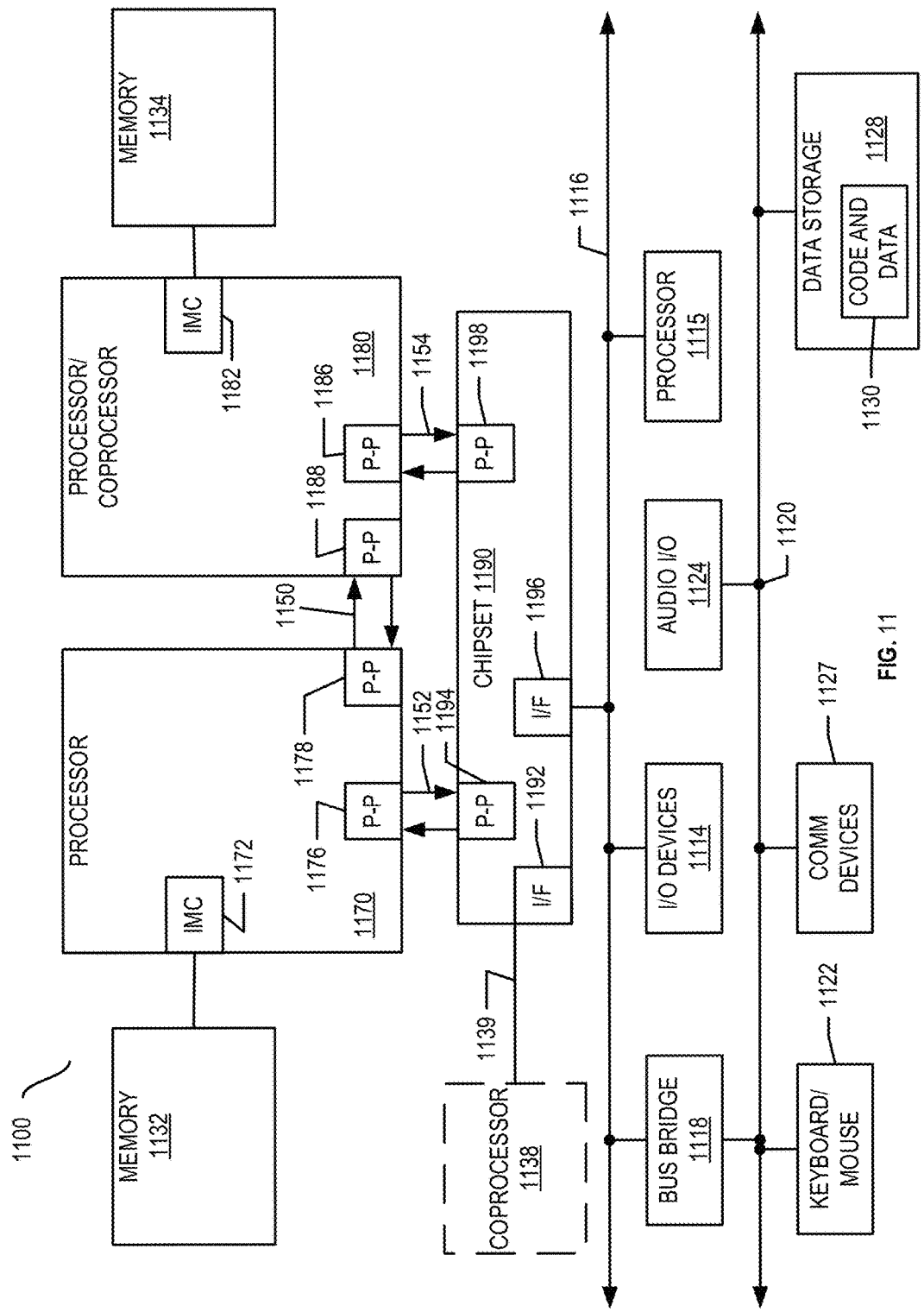
FIG. 11 illustrates a block diagram of a second system in accordance with an embodiment of the present invention.

Referring now to FIG. 11, shown is a block diagram of a first more specific exemplary system 1100 in accordance with an embodiment of the present invention. As shown in FIG. 11, multiprocessor system 1100 is a point-to-point interconnect system, and includes a first processor 1170 and a second processor 1180 coupled via a point-to-point interconnect 1150. Each of processors 1170 and 1180 may be some version of the processor 900. In one embodiment of the invention, processors 1170 and 1180 are respectively processors 1010 and 1015, while coprocessor 1138 is coprocessor 1045. In another embodiment, processors 1170 and 1180 are respectively processor 1010 coprocessor 1045.

Processors 1170 and 1180 are shown including integrated memory controller (IMC) hardware 1172 and 1182, respectively. Processor 1170 also includes as part of its bus controller hardware point-to-point (P-P) interfaces 1176 and 1178; similarly, second processor 1180 includes P-P interfaces 1186 and 1188. Processors 1170, 1180 may exchange information via a point-to-point (P-P) interface 1150 using P-P interface circuits 1178, 1188. As shown in FIG. 11, IMCs 1172 and 1182 couple the processors to respective memories, namely a memory 1132 and a memory 1134, which may be portions of main memory locally attached to the respective processors.

Processors 1170, 1180 may each exchange information with a chipset 1190 via individual P-P interfaces 1152, 1154 using point to point interface circuits 1176, 1194, 1186, 1198. Chipset 1190 may optionally exchange information with the coprocessor 1138 via a high-performance interface 1139. In one embodiment, the coprocessor 1138 is a special-purpose processor, such as, for example, a high-throughput MIC processor, a network or communication processor, compression engine, graphics processor, GPGPU, embedded processor, or the like.

A shared cache (not shown) may be included in either processor or outside of both processors, yet connected with the processors via P-P interconnect, such that either or both processors' local cache information may be stored in the shared cache if a processor is placed into a low power mode.

Chipset 1190 may be coupled to a first bus 1116 via an interface 1196. In one embodiment, first bus 1116 may be a Peripheral Component Interconnect (PCI) bus, or a bus such as a PCI Express bus or another third generation I/O interconnect bus, although the scope of the present invention is not so limited.

As shown in FIG. 11, various I/O devices 1114 may be coupled to first bus 1116, along with a bus bridge 1118 which couples first bus 1116 to a second bus 1120. In one embodiment, one or more additional processor(s) 1115, such as coprocessors, high-throughput MIC processors, GPGPU's, accelerators (such as, e.g., graphics accelerators or digital signal processing (DSP) hardware), field programmable gate arrays, or any other processor, are coupled to first bus 1116. In one embodiment, second bus 1120 may be a low pin count (LPC) bus. Various devices may be coupled to a second bus 1120 including, for example, a keyboard and/or mouse 1122, communication devices 1127 and a storage hardware 1128 such as a disk drive or other mass storage device which may include instructions/code and data 1130, in one embodiment. Further, an audio I/O 1124 may be coupled to the second bus 1120. Note that other architectures are possible. For example, instead of the point-to-point architecture of FIG. 11, a system may implement a multi-drop bus or other such architecture.

Figure 12:
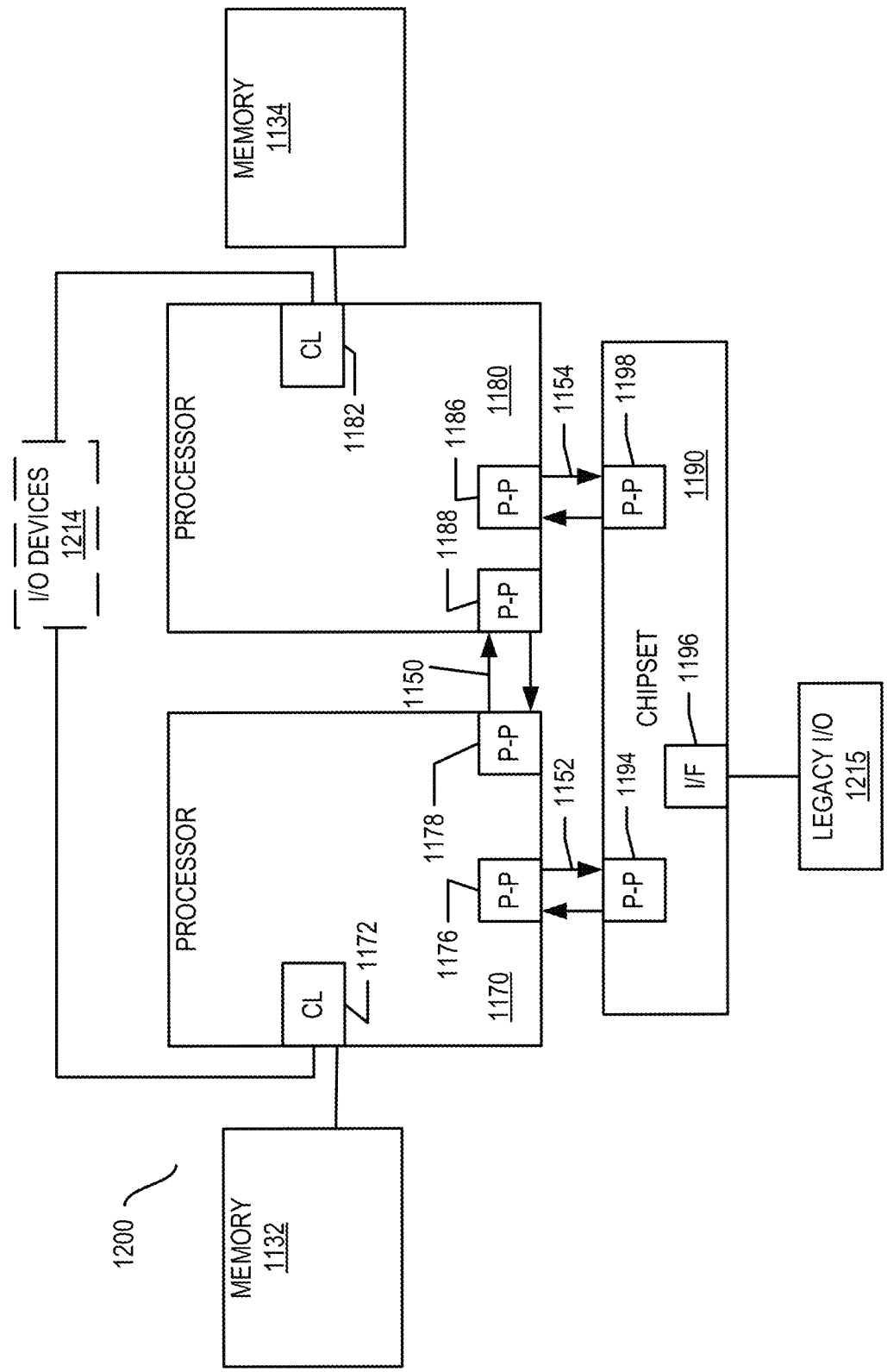
FIG. 12 illustrates a block diagram of a third system in accordance with an embodiment of the present invention.

Referring now to FIG. 12, shown is a block diagram of a second more specific exemplary system 1200 in accordance with an embodiment of the present invention. Like elements in FIGS. 11 and 12 bear like reference numerals, and certain aspects of FIG. 11 have been omitted from FIG. 12 in order to avoid obscuring other aspects of FIG. 12.

FIG. 12 illustrates that the processors 1170, 1180 may include integrated memory and I/O control logic ("CL") 1172 and 1182, respectively. Thus, the CL 1172, 1182 include integrated memory controller hardware and include I/O control logic. FIG. 12 illustrates that not only are the memories 1132, 1134 coupled to the CL 1172, 1182, but also that I/O devices 1214 are also coupled to the control logic 1172, 1182. Legacy I/O devices 1215 are coupled to the chipset 1190.

Figure 13:
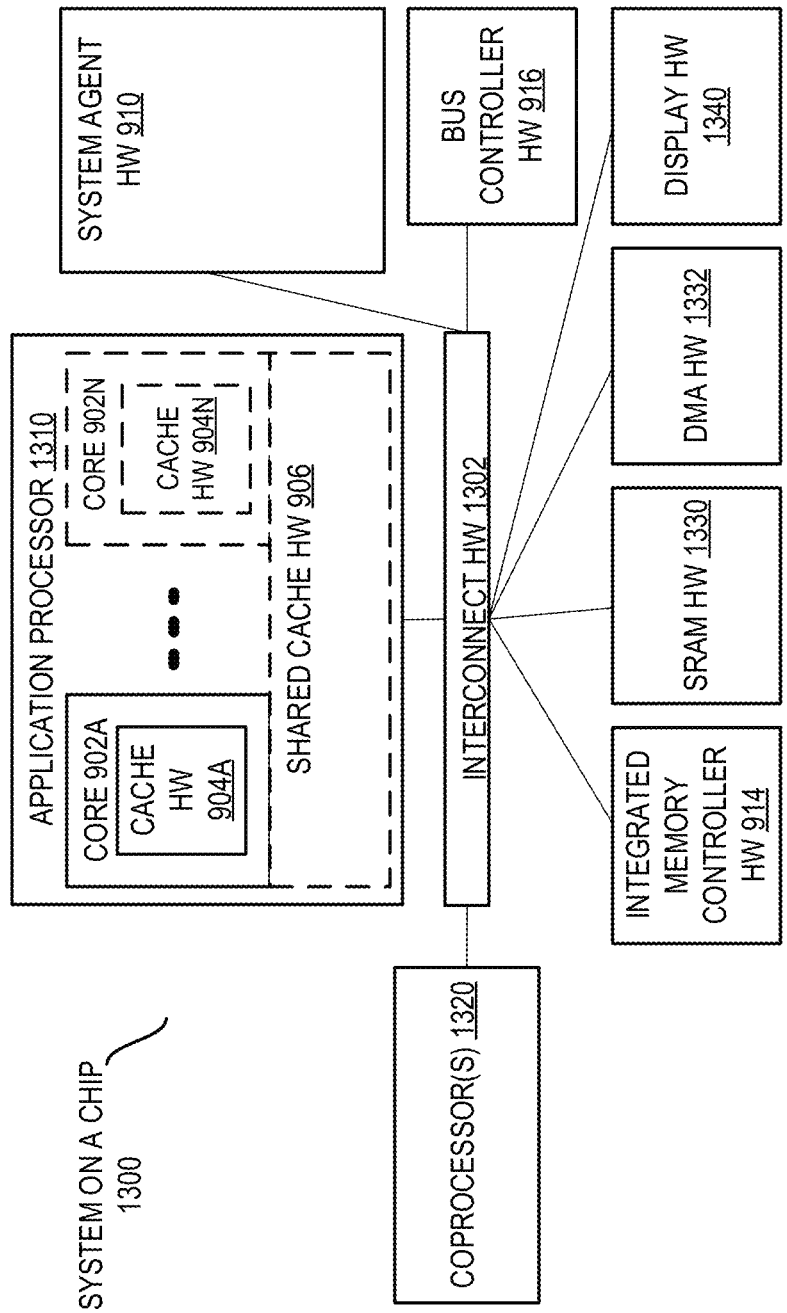
FIG. 13 illustrates a block diagram of a system on a chip (SoC) in accordance with an embodiment of the present invention.

Referring now to FIG. 13, shown is a block diagram of a SoC 1300 in accordance with an embodiment of the present invention. Similar elements in FIG. 9 bear like reference numerals. Also, dashed lined boxes are optional features on more advanced SoCs. In FIG. 13, an interconnect hardware 1302 is coupled to: an application processor 1310 which includes a set of one or more cores 902A-N and shared cache hardware 906; a system agent hardware 910; a bus controller hardware 916; an integrated memory controller hardware 914; a set or one or more coprocessors 1320 which may include integrated graphics logic, an image processor, an audio processor, and a video processor; an static random access memory (SRAM) hardware 1330; a direct memory access (DMA) hardware 1332; and a display hardware 1340 for coupling to one or more external displays. In one embodiment, the coprocessor(s) 1320 include a special-purpose processor, such as, for example, a network or communication processor, compression engine, GPGPU, a high-throughput MIC processor, embedded processor, or the like.

Embodiments of the mechanisms disclosed herein may be implemented in hardware, software, firmware, or a combination of such implementation approaches. Embodiments of the invention may be implemented as computer programs or program code executing on programmable systems comprising at least one processor, a storage system (including volatile and non-volatile memory and/or storage elements), at least one input device, and at least one output device.

Program code, such as code 1130 illustrated in FIG. 11, may be applied to input instructions to perform the functions described herein and generate output information. The output information may be applied to one or more output devices, in known fashion. For purposes of this application, a processing system includes any system that has a processor, such as, for example; a digital signal processor (DSP), a microcontroller, an application specific integrated circuit (ASIC), or a microprocessor.

The program code may be implemented in a high level procedural or object oriented programming language to communicate with a processing system. The program code may also be implemented in assembly or machine language, if desired. In fact, the mechanisms described herein are not limited in scope to any particular programming language. In any case, the language may be a compiled or interpreted language.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that actually make the logic or processor.

Such machine-readable storage media may include, without limitation, non-transitory, tangible arrangements of articles manufactured or formed by a machine or device, including storage media such as hard disks, any other type of disk including floppy disks, optical disks, compact disk read-only memories (CD-ROMs), compact disk rewritable's (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), phase change memory (PCM), magnetic or optical cards, or any other type of media suitable for storing electronic instructions.

Accordingly, embodiments of the invention also include non-transitory, tangible machine-readable media containing instructions or containing design data, such as Hardware Description Language (HDL), which defines structures, circuits, circuitries, apparatuses, processors and/or system features described herein. Such embodiments may also be referred to as program products.

In some cases, an instruction converter may be used to convert an instruction from a source instruction set to a target instruction set. For example, the instruction converter may translate (e.g., using static binary translation, dynamic binary translation including dynamic compilation), morph, emulate, or otherwise convert an instruction to one or more other instructions to be processed by the core. The instruction converter may be implemented in software, hardware, firmware, or a combination thereof. The instruction converter may be on processor, off processor, or part on and part off processor.

Figure 14:
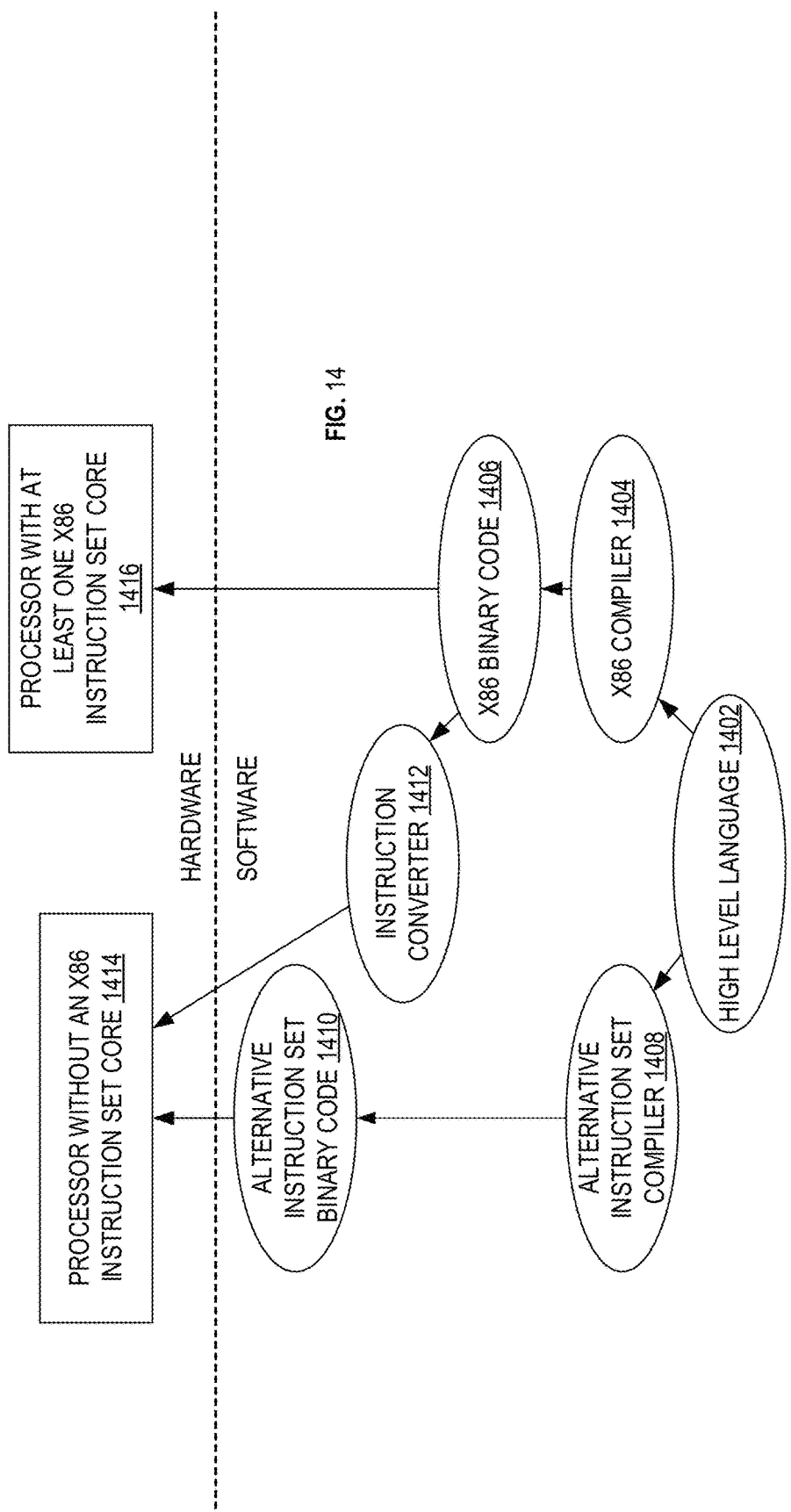
FIG. 14 illustrates a block diagram contrasting the use of a software instruction converter to convert binary instructions in a source instruction set to binary instructions in a target instruction set according to embodiments of the invention.

FIG. 14 is a block diagram contrasting the use of a software instruction converter to convert binary instructions in a source instruction set to binary instructions in a target instruction set according to embodiments of the invention. In the illustrated embodiment, the instruction converter is a software instruction converter, although alternatively the instruction converter may be implemented in software, firmware, hardware, or various combinations thereof. FIG. 14 shows a program in a high level language 1402 may be compiled using an x86 compiler 1404 to generate x86 binary code 1406 that may be natively executed by a processor with at least one x86 instruction set core 1416. The processor with at least one x86 instruction set core 1416 represents any processor that can perform substantially the same functions as an Intel processor with at least one x86 instruction set core by compatibly executing or otherwise processing (1) a substantial portion of the instruction set of the Intel x86 instruction set core or (2) object code versions of applications or other software targeted to run on an Intel processor with at least one x86 instruction set core, in order to achieve substantially the same result as an Intel processor with at least one x86 instruction set core. The x86 compiler 1404 represents a compiler that is operable to generate x86 binary code 1406 (e.g., object code) that can, with or without additional linkage processing, be executed on the processor with at least one x86 instruction set core 1416. Similarly, FIG. 14 shows the program in the high level language 1402 may be compiled using an alternative instruction set compiler 1408 to generate alternative instruction set binary code 1410 that may be natively executed by a processor without at least one x86 instruction set core 1414 (e.g., a processor with cores that execute the MIPS instruction set of MIPS Technologies of Sunnyvale, Calif. and/or that execute the ARM instruction set of ARM Holdings of Sunnyvale, Calif.). The instruction converter 1412 is used to convert the x86 binary code 1406 into code that may be natively executed by the processor without an x86 instruction set core 1414. This converted code is not likely to be the same as the alternative instruction set binary code 1410 because an instruction converter capable of this is difficult to make; however, the converted code will accomplish the general operation and be made up of instructions from the alternative instruction set. Thus, the instruction converter 1412 represents software, firmware, hardware, or a combination thereof that, through emulation, simulation or any other process, allows a processor or other electronic device that does not have an x86 instruction set processor or core to execute the x86 binary code 1406.

Although some embodiments have been described in reference to particular implementations, other implementations are possible according to some embodiments. Additionally, the arrangement and/or order of elements or other features illustrated in the drawings and/or described herein need not be arranged in the particular way illustrated and described. Many other arrangements are possible according to some embodiments.

In each system shown in a figure, the elements in some cases may each have a same reference number or a different reference number to suggest that the elements represented could be different and/or similar. However, an element may be flexible enough to have different implementations and work with some or all of the systems shown or described herein. The various elements shown in the figures may be the same or different. Which one is referred to as a first element and which is called a second element is arbitrary.

In the description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other.

An embodiment is an implementation or example of the inventions. Reference in the specification to "an embodiment," "one embodiment," "some embodiments," or "other embodiments" means that a particular feature, structure, or characteristic described in connection with the embodiments is included in at least some embodiments, but not necessarily all embodiments, of the inventions. The various appearances "an embodiment," "one embodiment," or "some embodiments" are not necessarily all referring to the same embodiments.

Not all components, features, structures, characteristics, etc. described and illustrated herein need be included in a particular embodiment or embodiments. If the specification states a component, feature, structure, or characteristic "may", "might", "can" or "could" be included, for example, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the drawings. Rather, the scope of the invention is to be determined entirely by the following claims, which are to be construed in accordance with established doctrines of claim interpretation.

What is claimed is:

1. A system comprising:
a plurality of voltage droop monitoring circuitries, each voltage droop monitoring circuitry corresponding to one of a plurality of power blocks, wherein each power block is powered by a corresponding power rail;
a latch-up detection circuitry communicatively coupled to the plurality of voltage droop monitoring circuitries, the latch-up detection circuitry to:
receive frequency information from the plurality of voltage droop monitoring circuitries; and
determine an abnormal variation based on the received frequency information to identify a first power block, out of the plurality of power blocks, experiencing a latch-up event; and
a voltage regulator circuitry communicatively coupled to the latch-up detection circuitry and each of the corresponding power rails, the voltage regulator circuitry to:
cause a power reset in the first power block without interrupting power to rest of the plurality of power blocks.

2. The system of claim 1, wherein each of the plurality of voltage droop monitoring circuitries comprises a ring oscillator and a counter.

3. The system of claim 2, wherein the ring oscillator measures a frequency based on a voltage of the power rail.

4. The system of claim 2, wherein the ring oscillator measures a frequency based on a current of the power rail.

5. The system of claim 1, wherein the latch-up detection circuitry further to:
normalize the received frequency information from each of the plurality of voltage droop monitoring circuitries;
create a matrix of cross-correlation values based on the normalized received frequency information between each pair of the plurality of power blocks; and
determine deviations in the cross-correlation values indicating an occurrence of voltage droop.

6. The system of claim 5, wherein the latch-up detection circuitry further to:
assign a likelihood of latch-up based on the determined deviations in the cross-correlation values.

7. The system of claim 6, wherein the likelihood of latch-up comprises a plurality of levels.

8. The system of claim 7, wherein each level of the plurality of levels is associated with one or more mitigation measures.

9. The system of claim 8, wherein the one of the one or more mitigation measures comprises signaling the voltage regulator circuitry to reset power to the first power block.

10. The system of claim 9, wherein the one of the one or more mitigation measures comprises reporting the latch-up event to a system administrator.

11. A method implemented in an integrated circuit, the method comprising:
receiving frequency information from a plurality of voltage droop monitoring circuitries, wherein each voltage droop monitoring circuitry corresponds to one of a plurality of power blocks, each power block powered by a respective power rail;
determining an abnormal variation based on the received frequency information to identify a first power block, out of the plurality of power blocks, experiencing a latch-up event; and
resetting power to the first power block without interrupting power to rest of the plurality of power blocks.

12. The method of claim 11, wherein each of the plurality of voltage droop monitoring circuitries comprises a ring oscillator and a counter.

13. The method of claim 12, further comprises measuring a frequency of the ring oscillator based on a voltage of the power rail.

14. The method of claim 12, further comprises measuring a frequency of the ring oscillator based on a current of the power rail.

15. The method of claim 11, further comprises:
- normalizing the received frequency information from each of the plurality of voltage droop monitoring circuitries;
- creating a matrix of cross-correlation values based on the normalized frequency information between each pair of the plurality of power blocks; and
- determining deviations in the cross-correlation values indicating an occurrence of voltage droop.

16. The method of claim 15, further comprises:
- assigning a likelihood of latch-up based on the determined deviations in the cross-correlation values.

17. The method of claim 16, wherein the likelihood of latch-up comprises a plurality of levels.

18. The method of claim 17, wherein each level of the plurality of levels is associated with one or more mitigation measures.

19. The method of claim 11, further comprises storing a report of the latch-up event in a system log.

20. The method of claim 11, further comprises reporting the latch-up event to a system administrator.

* * * * *